United States Patent [19] — [11] 3,839,781
Russell — [45] Oct. 8, 1974

[54] METHOD FOR DISCRETIONARY SCRIBING AND BREAKING SEMICONDUCTOR WAFERS FOR YIELD IMPROVEMENT

[75] Inventor: Lewis Keith Russell, San Jose, Calif.

[73] Assignee: Signetics Corporation, Sunnyvale, Calif.

[22] Filed: Nov. 5, 1973

[21] Appl. No.: 412,919

Related U.S. Application Data

[63] Continuation of Ser. No. 136,110, April 21, 1971, abandoned.

[52] U.S. Cl. .......... 29/574, 29/577
[51] Int. Cl. .......... B01j 17/00
[58] Field of Search .......... 29/574, 577, 583, 577 IC

[56] References Cited

UNITED STATES PATENTS

| | | | |
|---|---|---|---|
| 3,304,594 | 2/1967 | Madland | 29/577 |
| 3,377,513 | 4/1968 | Ashby | 29/574 |
| 3,550,261 | 12/1970 | Schroeder | 29/583 |
| 3,590,478 | 7/1971 | Takehana | 29/583 |
| 3,618,201 | 11/1971 | Makimoto | 29/577 |
| 3,673,016 | 6/1972 | Gerstner | 29/583 |
| 3,771,219 | 11/1973 | Tuzi | 29/583 |

*Primary Examiner*—Roy Lake
*Assistant Examiner*—W. C. Tupman
*Attorney, Agent, or Firm*—Flehr, Hohbach, Test, Albritton & Herbert

[57] ABSTRACT

A method of manufacturing integrated circuits in which circuit yield for each wafer of integrated circuits is increased. An integrated circuit wafer has defined thereon a plurality of separate integrated circuit chips. The function of the separate integrated circuit chips is joined by appropriate metallization passing through what are normally scribe lines separating the integrated circuit chips. The separate integrated circuit chips are tested to identify those which contain good circuits and those which contain circuits which are to be rejected. Good circuit chips are left joined together while reject circuits are separated by a discretionary scribe and break operation.

6 Claims, 7 Drawing Figures

INVENTOR.
LEWIS K. RUSSELL

BY Flehr, Hohbach, Test, Albritton & Herbert
ATTORNEYS

INVENTOR.
LEWIS K. RUSSELL
BY
Flehr, Hohbach, Test,
Albritton & Herbert
ATTORNEYS INVENTOR.
LEWIS K. RUSSELL
BY
Flehr, Hohbach, Test
Albritton & Herbert
ATTORNEYS INVENTOR.
LEWIS K. RUSSELL
BY
Flehr, Hohbach, Test, Albritton & Herbert
ATTORNEYS

METHOD FOR DISCRETIONARY SCRIBING AND BREAKING SEMICONDUCTOR WAFERS FOR YIELD IMPROVEMENT

This is a continuation, of application Ser. No. 136,110 filed Apr. 21, 1971, and now abandoned.

BACKGROUND OF THE INVENTION

This invention generally pertains to a method of making integrated circuits and more specifically pertains to a method for increasing the yield of integrated circuits from a semiconductor wafer.

One of the greatest problems of large scale integration of electronic circuits is that of obtaining high enough circuit yield on each wafer of circuits in order to be commercially profitable. As the number of devices (i.e., gates) per circuit increases, the yield decreases proportionally. It is desirable to obtain a large circuit by combining several small circuits — circuits small enough to be able to obtain a decent yield. One way in which to accomplish this is through the use of hybrid circuits in which several integrated circuit chips are mounted on one printed circuit board. This method has its own yield and reliability problems as well as being expensive. Another prior art approach is called discretionary wiring whereby an additional level of metallization is formed on a semiconductor wafer connecting only good integrated circuit chips. This method is also very costly since an additional mask must be formed for every wafer processed.

SUMMARY OF THE INVENTION

It is an object of this invention to provide an inexpensive and simple method for increasing the yield of good integrated circuits in semiconductor wafers.

It is another object of this invention to provide a method for interconnecting circuits on a semiconductor wafer through normal scribe lines.

It is another object of this invention to provide a discretionary method of scribing semiconductor wafers so that adjacent good integrated circuit chips are left joined and connected but are separated and disconnected from rejected or bad integrated circuit chips.

Briefly, in accordance with one embodiment of this invention, an integrated circuit wafer has defined thereon a plurality of separate integrated circuit chips. The separate integrated circuit chips are electrically interconnected by conducting paths passing through what are normally scribe lines separating the integrated circuit chips. The integrated circuit chips are tested to identify those which are good and those which are bad. Adjacent good circuit chips are left joined together while bad circuit chips are separated by a discretionary scribe and break operation so that adjacent good circuits remain physically and electrically interconnected but are physically and electrically disconnected from bad circuits.

DESCRIPTION OF THE PREFERRED EMBODIMENTS

Figure 1:
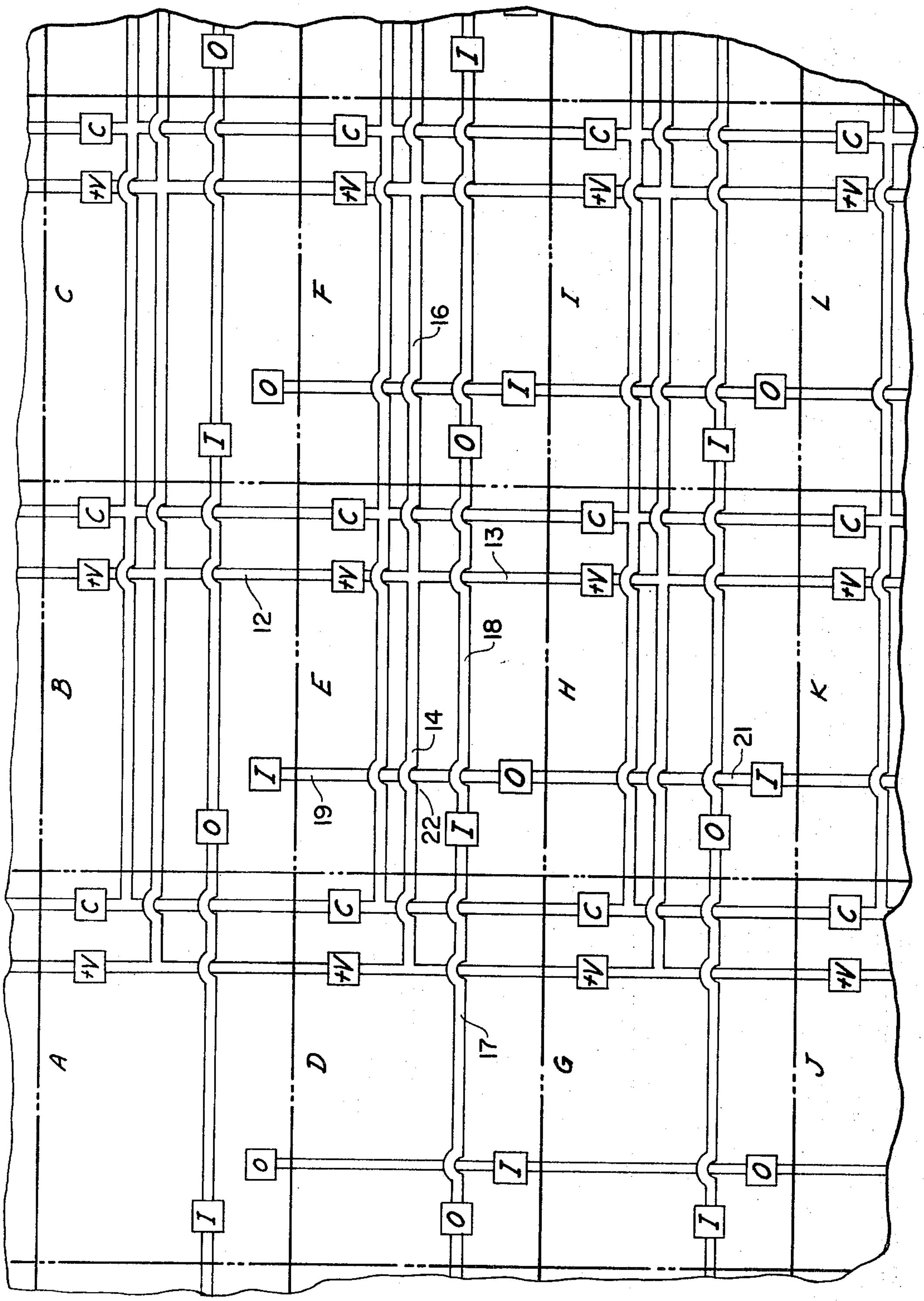
FIG. 1 is a generallized diagram of a portion of a semi-conductor wafer having a plurality of integrated circuits chips which are electrically interconnected.

Referring to FIG. 1, there is shown a generallized diagram of a portion of a semiconductor wafer 11 which contains a plurality of integrated circuits. The individual integrated circuit chips are consecutively alphabetically labeled A through L and are shown separated in FIG. 1 by dashed lines which represent areas on the semiconductor wafer which can be scribed and along which the wafer may be subsequently broken. For purposes of this illustration the individual integrated circuits A through L may be considered identical and can be, for example, shift registers or other logic blocks.

Details of the individual integrated circuits A through L are not shown in FIG. 1. Each of these integrated circuits can include typical semiconductor devices such as transistors, diodes, etc. Each of the integrated circuits further includes metallization thereon interconnecting in appropriate fashion the various semiconductor devices. For purposes of this generallized discussion let it be assumed that each of the integrated circuits A through L, besides appropriate metallization interconnecting the various devices within each integrated circuit (not shown in FIG. 1) also has metallization labeled I which constitutes the input to the integrated circuit and metallization labeled 0 which constitutes the output from the integrated circuit. Each individual integrated circuit also includes a metallization block or pad labeled +V through which operating voltage can be applied to the integrated circuit and a metallization block or pad labeled C through which clock or synchronizing signals may be applied to the integrated circuit.

As shown in FIG. 1 and in accordance with this invention, the functions of each of the integrated circuit chips labeled A through L are electrically interconnected to adjacent integrated circuit chips through conducting paths which cross the areas between adjacent integrated circuit chips shown by the dashed lines in FIG. 1. Thus, for example, the integrated circuit chip E has its metallization pad labeled +V connected by metallization 12 to the +V pad of integrated circuit chip B, connected by metallization 13 to the +V pad of integrated circuit chip H, connected by metallization 14 to the +V pad of integrated circuit chip D and connected by metallization 16 to the +V pad of integrated circuit chip F.

The integrated circuit chip F in a similar fashion has its metallization pad C connected by appropriate metallization of adjacent integrated circuit chips B, H, D and F.

The metallization pattern interconnecting the output 0 and input I metallization pads of the integrated circuit chips A through L in FIG. 1 assumes that the individual integrated circuit chips contain circuits (such as shift registers) which form usable larger circuits when connected in series with other integrated circuit chips. Thus, the integrated circuit chip E has its input metallization pad I connected to the output metallization pad of integrated circuit chip D by metallization 17 and connected to the output pad of integrated circuit chip F by metallization 18. The output metallization pad O of integrated circuit chip E is connected by metallization 19 to the input metallization pad I of integrated circuit chip B and connected by metallization 21 to the input metallization pad I of integrated circuit chip H. Similar metallization is provided for interconnecting each of the integrated circuit chips A through L to adjacent integrated circuits as shown in FIG. 1. On the other hand, the integrated circuit chips cooperate to form a larger circuit when connected in parallel, then the output pads O and input pads I of each of the integrated circuit chips would be connected to the output and input pads, respectively of each of the adjacent integrated circuit packages.

In FIG. 1 some of the metallization is shown crossing other of the metallization. Thus, referring to the integrated circuit chip E, for example, the metallization 19 is shown crossing the metallization 14 at a crossover point generally indicated by reference number all 22. The crossover point 22 can be any of the well known arrangements for providing two electrically insulated conducting paths. For example, two layers of metallization can be provided insulated from one another by silicon dioxide or some other insulator. Alternatively, a diffused conducting path in the semiconductor wafer can form a part of one of the conducting paths with a layer of silicon dioxide or some other appropriate insulator insulating the diffused path from metallization forming another of the conducting paths in the vicinity of the crossover. Other crossover arrangements such as a silicon gate MOS would also be satisfactory.

In accordance with this invention the metallization or other conducting paths which are formed between adjacent integrated circuit chips is formed at the same time metallization or other conducting paths are formed within each of the integrated circuit chips for interconnecting the various semiconductor devices formed within a single integrated circuit chip. This interconnection metallization for connecting the various devices within a single integrated circuit chip is not shown in FIG. 1 but is formed in accordance with techniques well known in the art.

After a semiconductor wafer has been formed into interconnected integrated circuit chips as illustrated in FIG. 1, the semiconductor wafer undergoes a testing step to ascertain which of the integrated circuit chips contain properly functioning circuits and devices ("good") and which of the integrated circuit chips contains improperly formed or malfunctioning circuits and devices ("bad"). The testing step may be performed manually with an operator applying the proper voltages and test probes to each of the individual integrated circuits or the testing may be performed with test probes under computer control. In either case a notation is made of which of the individual integrated circuits are good and which are bad.

The record or notation of which of the integrated circuit chips are good and which are bad is then utilized to determine the manner in which the semiconductor wafer will be scribed. The semi-conductor wafer is scribed in such a fashion that only adjacent good integrated circuit chips are left physically and electrically connected together. That is, the areas on the semiconductor wafer between adjacent good semiconductor chips is not scribed but the areas between adjacent good and bad integrated circuit chips are scribed. Scribing can be performed utilizing any of the well known techniques in the art. Such techniques, for example, include scribing with a diamond knife or by a scanning electron beam developing an electron sensitive photoresist on the wafer surface which can then be scribed by etching. The scribing can be done by hand or, alternatively, a scriber can be computer controlled with the computer utilizing the information as to good and bad integrated circuit chips developed during testing.

After scribing, the semiconductor wafer is broken along to scribe lines to form individual pieces and, in accordance with this invention, the resulting individual pieces comprise a plurality of separate integrated circuit chips which are physically and electrically interconnected. The number of integrated circuit chips so interconnected to form one piece depends upon the maximum size desired and upon the number of adjacent individual integrated circuit chips which are good. Thus, from a single semiconductor wafer there will result pieces containing varying numbers of individual interconnected integrated circuits. Some will contain one integrated circuit, some two, some three, some four, etc.

Figure 2:
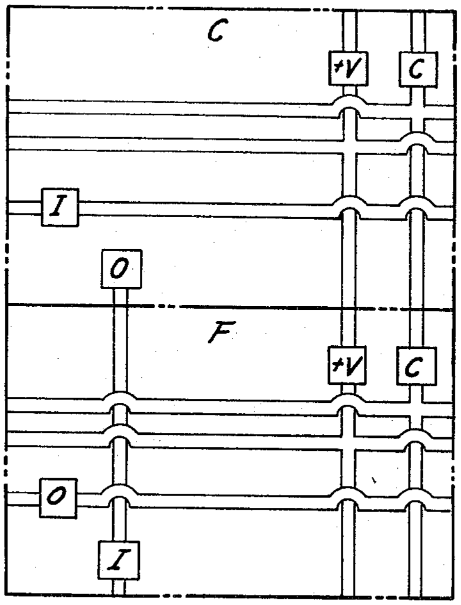
FIG. 2 is an illustration of a portion of the semiconductor wafer of FIG. 1 after scribing and breaking in which two a adjacent integrated circuit chips have been left physically and electrically connected.

Assume that of the individual integrated circuits shown in FIG. 1, that B, E and I are bad but that C and F are both good. Scribing will define a perimeter about the combination of integrated circuits C and F so that after breaking a piece results such as shown in FIG. 2. The function of integrated circuit C is electrically connected to the function of integrated circuit F through the metallization or other conducting paths extending across the area between integrated circuit C and integrated circuit F. The interconnections which had existed between the integrated circuits C and F and the integrated circuits B, E and I have been severed by scribing and breaking.

Figure 3:
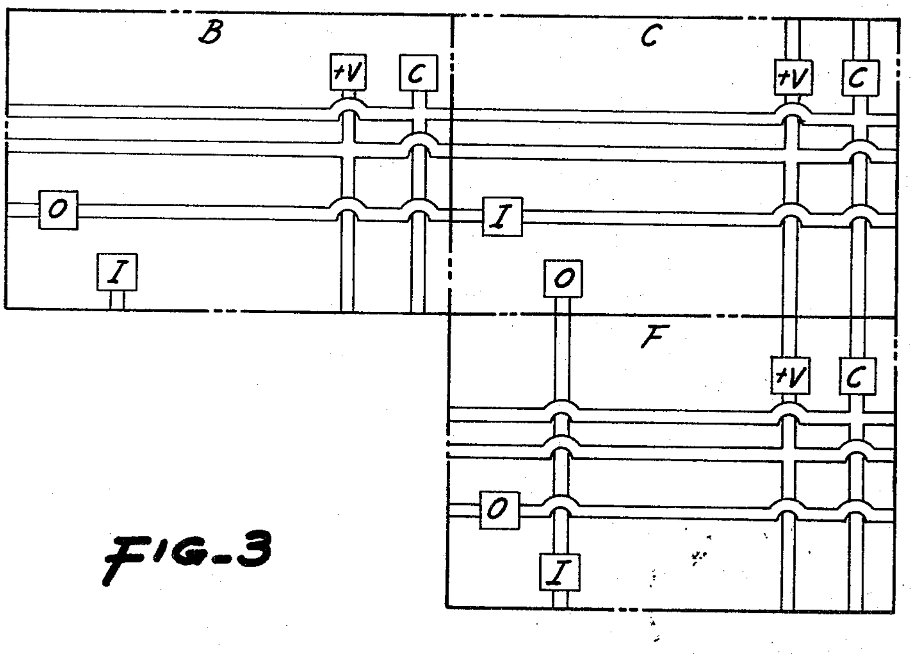
FIG. 3 is similar to FIG. 2 but shows three adjacent integrated circuit chips left physically and electrically connected.

Similarly, FIG. 3 shows the resulting piece for the case in which integrated circuit B as well as C and F are good. These three integrated circuits are left physcially and electrically interconnected but are phycially severed and hence electrically disconnected from the bad integrated circuits E and I. Thus, with respect to the B-C-F combination, only one set of electrical connections need to be made since the separate integrated circuits are electrically interconnected as hereinbefore described.

Figure 4:
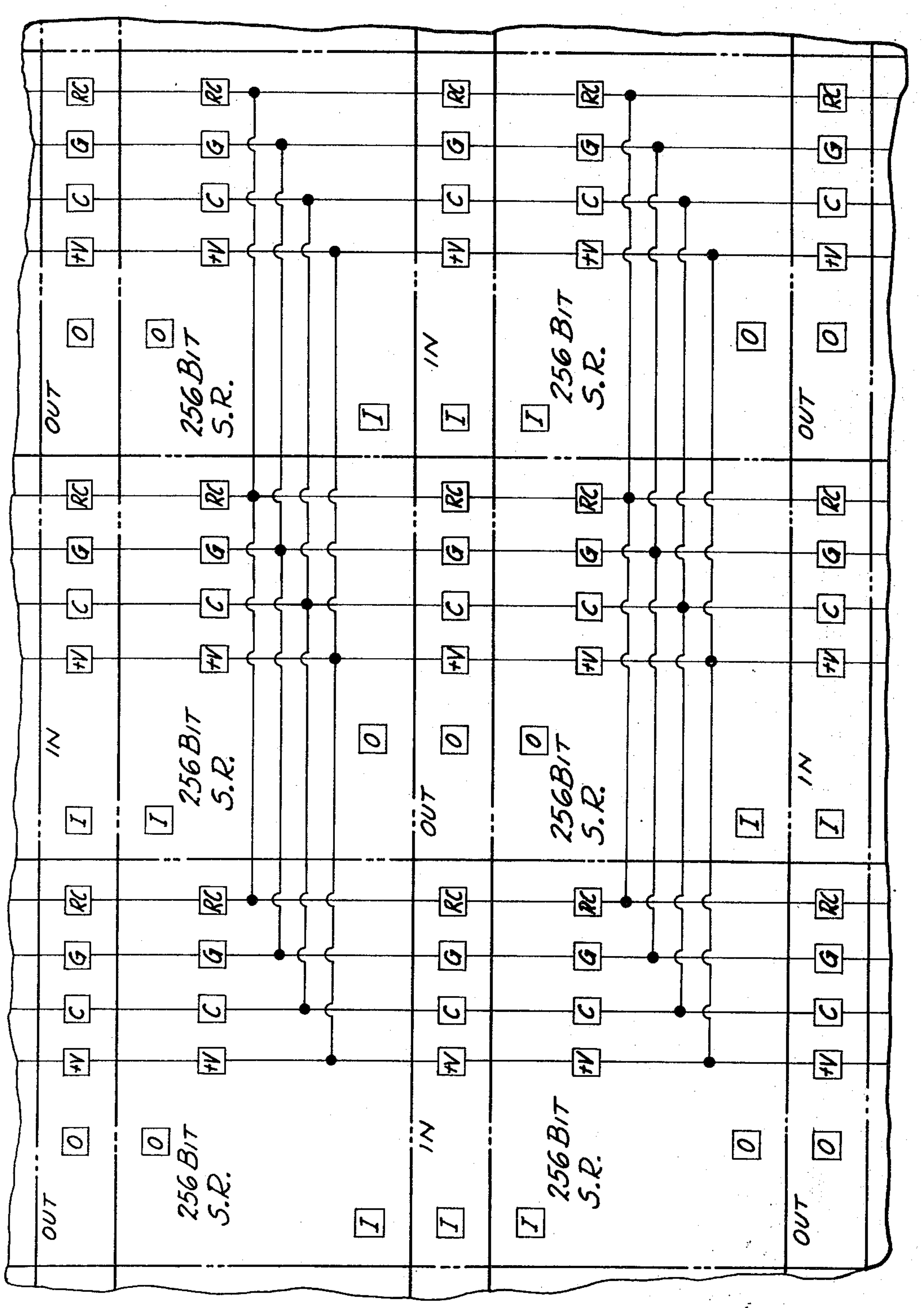
FIG. 4 is a diagram of a portion of a semiconductor wafer having a plurality of 256 bit shift registers and input and output circuits therefor which in accordance with this invention are electrically and physically interconnected.

Referring now to FIG. 4, there is shown a portion of a semiconductor wafer in which there has been formed in accordance with techniques well known in the art a plurality of 256 bit shift registers and a plurality of input and output circuits for the shift registers. Each of these separate integrated circuits is separated from adjacent integrated circuits by areas on the semiconductor wafer indicated by the dashed lines in FIG. 4 which can be scribed and along which the wafer can be broken. Each of the shift registers and input and output circuits are formed in accordance with techniques well known in the art. Thus, each includes semiconductor devices covered by a layer of silicon dioxide, for example, with metallization formed on top of the silicon dioxide and serving to interconnect the various semiconductor devices. The portions of this metallization shown in FIG. 4 are metallization areas or pads labeled +V, C, G and RC on each of the 256 bit shift registers, input circuits and output circuits. Operating voltage may be applied to the integrated circuits through the +V metallization pad, clock pulses may be applied through the C pad, ground may be applied through the G pad, and reset clock pulses may be applied through the RC metallization pad. Each input integrated circuit also has a metallization pad labeled I and each output integrated circuit has a metallization pad labeled O. Each of the 256 bit shift register integrated circuits also has a metallization pad labeled I for input and a metallization pad labeled O for output.

In accordance with this invention electrically conducting paths are formed in the semiconductor wafer which cross the areas between the separate integrated circuits and interconnect the +V, C, G and RC metallization pads of adjacent integrated circuits. These conducting paths can, as discussed before, be diffused conducting paths in the semiconductor wafer or appropriate metallization. Electrical crossovers are formed where the conducting paths cross and can be any of the well known techniques such as two layer metallization, etc. For simplicity, these electrically conducting paths are shown in FIG. 4 as simply lines but it should be understood that they have some width, such as shown in FIG. 1. In accordance with this invention these electrically conducting paths interconnecting the separate integrated circuits are formed at the same time that internal connections or metallization are formed within the individual integrated circuits so that no extra or additional steps are necessary.

The individual integrated circuits shown in FIG. 4 each undergo a testing operation in which the good circuits and the bad circuits are identified and noted. Then the semiconductor wafer is scribed with the scribing describing a perimeter around one good input integrated circuit, one good output integrated circuit and as many adjacent shift registers as are good. Then the semiconductor wafer is broken along the scribe lines to form separate pieces. Each separate piece thus formed contains one input circuit, one output circuit and one or more 256 bit shift register circuits.

Figure 5:
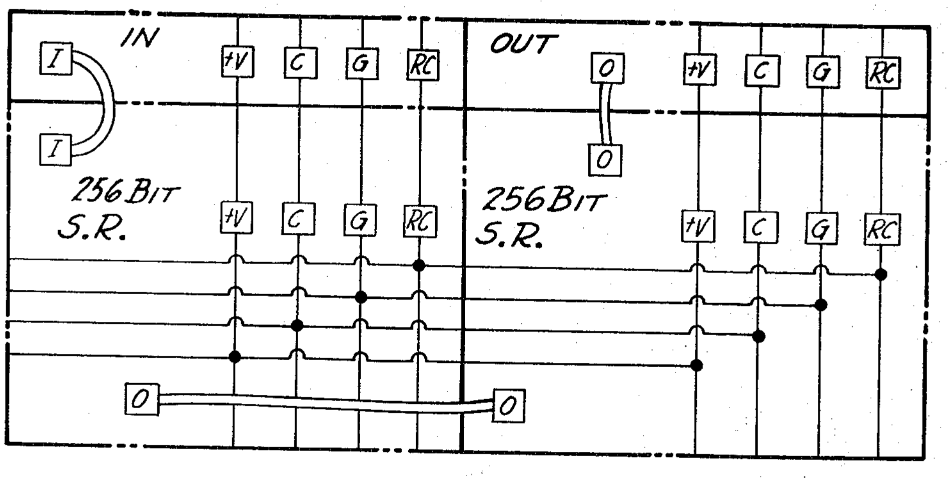
FIG. 5 shows a portion of the semiconductor wafer of FIG. 4 after scribing and breaking in which two 256 bit shift registers and one input and one output circuit are left physically and electrically interconnected to form a 512 bit shift register.

Referring to FIG. 5, for example, there is shown a typical resulting part of the semiconductor wafer in which one input circuit, one output circuit and two adjacent 256 bit shift registers are left physically and electrically interconnected. As shown in FIG. 5, the +V, C, G and RC metallization pads of each of these integrated circuits are interconnected by the conducting paths passing through the areas between the separate integrated circuits. The integrated circuits shown in FIG. 5 can then be interconnected through the use of wire bonds to form a 512 bit shift register with associated input and output circuitry.

Figures 6, 7:
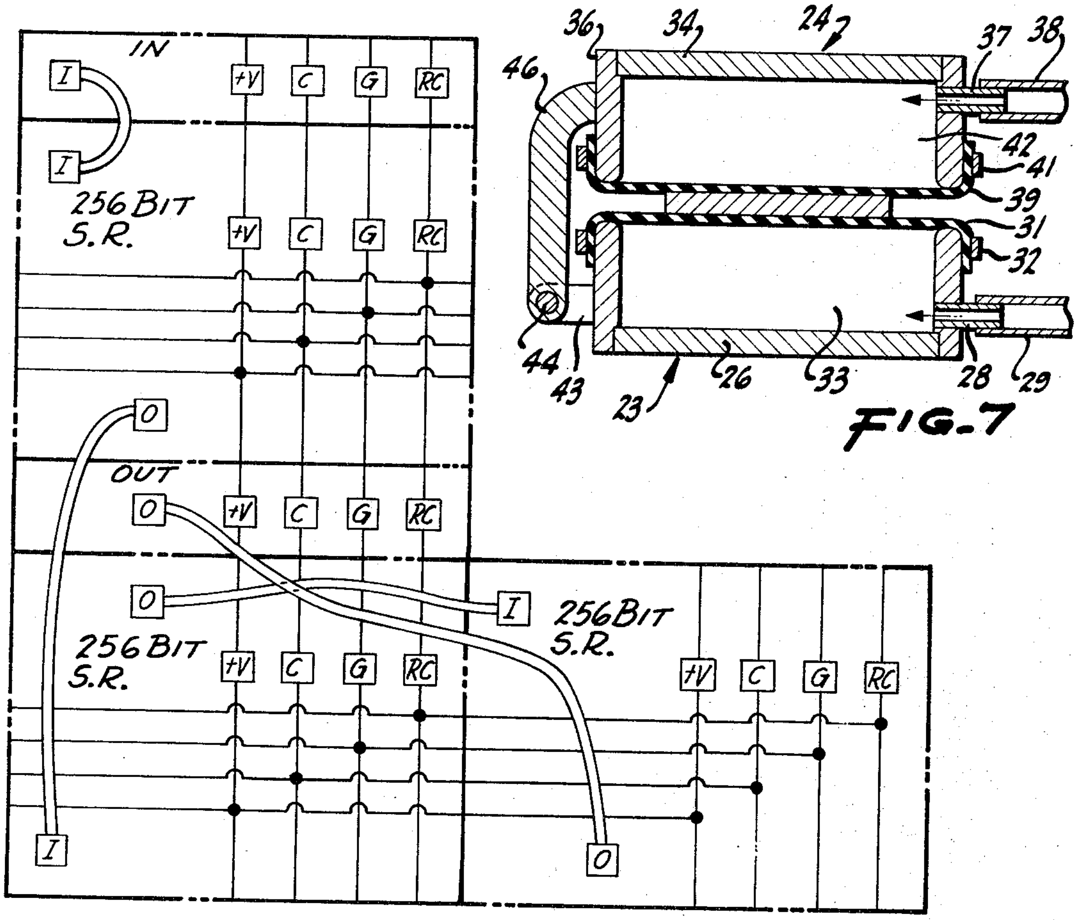
FIG. 6 is similar to FIG. 5 but shows three 256 bit shift registers and one input and one output circuit left physically and electrically joined to for a 768 bit shift register.
FIG. 7 is a cross sectional view of a circular wafer breaker suitable for breaking scribed wafers into individual pieces of varying size and configurations.

FIG. 6 shows another typical resulting part of the semiconductor wafer in which one input integrated circuit, one output integrated circuit and three 256 bit shift register integrated circuits are left physically and electrically interconnected. Through the use of a few simple wire bonds shown in FIG. 6 a 768 bit shift register with associated input and output circuitry remains.

In the examples shown in FIGS. 5 and 6, some wire bonds have been used to form some of the connections between the separate integrated circuits. However, within limitations of the performance of the final large interconnected circuit, these additional interconnections can be formed in the same manner and at the same time as the interconnections between the +V, C, G and RC metallization pads.

It is obvious that due to the discretionary scribing involved, that a scribed semiconductor wafer has portions of different sizes and configurations outlined thereon by the scribe lines. The prior art techniques of breaking scribed wafers into individual pieces are generally only satisfactory when the final pieces are of equal size and shape. They are not satisfactory when the pieces are of unequal size, shape and orientation. Referring to FIG. 7, there is shown a wafer breaker incorporating a technique that will accomplish this task. The wafer breaker has a bottom half 23 and a top half 24. The bottom half 23 has a base 26 and a circular wall 27. The circular wall 27 has a gas inlet 28 adapted to be connected to a source of gas indicated by the hose 29 in FIG. 7. A flexible membrane 31 is secured to the circular wall 27 by means such as clamping ring 32 and together with base 26 and circular wall 27 defines a cavity 33.

The top half 24 of the wafer breaker is similarly constructed, having a base 34 and circular wall 36. The circular wall 36 has a gas inlet 37 adapted to be connected to a gas source indicated by the hose 38. A flexible membrane 39 is secured to the circular wall 36 by means such as clamping ring 41 to define a cavity 42. The bottom half 23 of the wafer breaker has a member 43 which is connected by a pivot 44 to a member 46 of the top half 24 whereby the two halves are pivotally secured to one another.

In operation, a scribed semiconductor wafer 11 (shown greatly enlarged in thickness in FIG. 7) is placed on the flexible membrane 31 and the top half of the wafer breaker is pivoted closed so that flexible membrane 39 also contacts the scribed semiconductor wafer 11. The top half 24 is then locked in position with the bottom half 23 by suitable locking means (not shown in FIG. 7). Then gas under pressure is alternately admitted through the gas inlets 28 and 37 so that pressure builds first in cavity 33 and then in cavity 42. As the pressure builds, in each cavity, the flexible membranes 31 and 39 "balloon," exerting uniform bending stress in all directions and at all points of the wafer surface so that the wafer is broken along the scribe lines.

Thus, what has been described is an improved method for improving the yield of integrated circuits from a semiconductor wafer. The wafer has a plurality of relatively small, separate integrated circuits formed thereon which are electrically interconnected by conducting paths passing through what are normally scribe lines separating the separate integrated circuits. The integrated circuits are tested to identify those which are good and those which are bad. Adjacent good integrated circuits are left physically joined together to form relatively larger circuits while bad integrated circuits are separated by a discretionary scribe and break operation. Adjacent good circuits thereby remain physically and electrically interconnected but are physically and electrically disconnected from bad circuits.

I claim;

1. In a method for making integrated circuit structures providing a semiconductor wafer, forming a plurality of active and passive semiconductor devices in the wafer with the devices being arranged in predetermined repetitive patterns on the wafer with spaces on the wafer between the repetitive patterns, interconnecting by the use of conductive paths the active and passive devices in each repetitive pattern to form an integrated circuit, interconnecting each repetitive pattern with adjacent patterns by the use of conductive paths extending across said spaces between the patterns, testing the integrated circuit in each pattern to determine which integrated circuits are good and which are defective, separating the semiconductor wafer and certain of said conductive paths extending between said patterns to form separate parts whereby selected good integrated circuits in adjacent patterns remain physically and electrically joined together and defective integrated circuits in adjacent patterns are physically and electrically separated from the patterns having good integrated circuits.

2. A method as in claim 1 wherein the step of separating the semiconductor wafer and certain of said conductive paths includes the steps of forming discretionary scribe lines through certain of said conductive paths extending between said patterns and breaking the semiconductor wafer along the scribe path.

3. A method as in claim 1 wherein said step of interconnecting by the use of conductive paths the active and passive devices in each repetitive pattern to form an integrated circuit is performed simultaneously with the step of interconnecting each repetitive pattern with adjacent patterns by the use of conductive paths extending across said spaces between the patterns.

4. A method as in claim 1 wherein said step of interconnecting each repetitive pattern with adjacent patterns by the use of conductive paths extending across said spaces between the patterns includes forming electrical crossovers so that some of the conductive paths cross others of conductive paths but are insulated therefrom.

5. A method as in claim 4 wherein said step of forming conductive paths comprises forming two layers of metallization separated by an electric insulating layer.

6. A method as in claim 4 wherein said step of forming electrical crossovers includes forming diffused conducting regions which form part of some of the electrical conducting paths and which paths cross under and are electrically insulated from others of the conducting paths.

* * * * *